United States Patent [19]
Fasano et al.

[11] Patent Number: 5,872,695
[45] Date of Patent: Feb. 16, 1999

[54] INTEGRATED ELECTRONIC COMPONENTS HAVING CONDUCTIVE FILLED THROUGH HOLES

[75] Inventors: Benjamin V. Fasano, New Windsor, N.Y.; Churl S. Kim, Hopewell Junction, N.Y.

[73] Assignee: International Business Machines Corporation, Armonk, N.Y.

[21] Appl. No.: 806,561

[22] Filed: Feb. 26, 1997

[51] Int. Cl.[6] .............................. H01G 4/20; H01G 4/06; H01G 4/005

[52] U.S. Cl. .................. 361/301.4; 361/303; 361/306.1; 361/313

[58] Field of Search .................................... 361/302, 303, 361/305, 306.1, 306.3, 311, 312, 313, 320, 321.1–321.5, 329, 330; 29/25.42

[56] References Cited

U.S. PATENT DOCUMENTS

| | | | |
|---|---|---|---|
| 3,235,939 | 2/1966 | Rodriguez et al. | 29/25.42 |
| 4,347,650 | 9/1982 | McLarney et al. | 29/25.42 |
| 4,586,972 | 5/1986 | Yokotani et al. | 156/89.12 |
| 5,177,663 | 1/1993 | Ingleson et al. | 361/321 |
| 5,380,271 | 1/1995 | Gyory | 604/20 |
| 5,400,210 | 3/1995 | Sugimoto et al. | 361/321.5 |
| 5,590,016 | 12/1996 | Fujishiro et al. | 361/313 |
| 5,657,199 | 8/1997 | Devoe et al. | 361/328 |

OTHER PUBLICATIONS

Surface Mount Technology, Multilayer Ceramic Chip Capacitors: An Alternative to Tantalums, May 1991.

*Primary Examiner*—Kristine Kincaid
*Assistant Examiner*—Anthony Dinkins
*Attorney, Agent, or Firm*—DeLio & Peterson, LLC; Peter W. Peterson; Aziz M. Ahsan

[57] ABSTRACT

A pad printer is used to apply multiple patterned layers of alternating materials to form capacitors and resistors within or on ceramic packages. Fast drying resistive, conductive and dielectric inks are used to form very thin (from about 5 to 20 micron) patterned layers for integrated resistors and capacitors. The integrated capacitors may be interconnected in various configuration by patterning clearance holes into the conductive layers which allows the pass-through of electrical connections.

4 Claims, 4 Drawing Sheets

INTEGRATED ELECTRONIC COMPONENTS HAVING CONDUCTIVE FILLED THROUGH HOLES

BACKGROUND OF THE INVENTION

1. Field of the Invention

The present invention relates to electronics components and, in particular, to a process for producing integrated electronic capacitors and resistors.

2. Description of Related Art

Common parallel plate capacitors have two spaced parallel conducting plates separated by a dielectric. The capacitance is a function of the area of the plates and the thickness of the dielectric between the plates. This relationship is defined by the equation $C=\epsilon A/d$ where C is capacitance, $\epsilon$ is the permittivity of the dielectric, A is the area and d is the plate separation or dielectric thickness. As a function of the equation, and without changing the dielectric, the capacitance can be increased by increasing the area of the plates or by decreasing the dielectric thickness.

Microelectronic components and packages are small in area and technology is driving them to be smaller and smaller; therefore, increasing the size of the plates is not a favorable option when seeking to increase the capacitance of a package or component. Decreasing the thickness of the dielectric between the plates is a favorable way to increase the capacitance while decreasing the size of the package. Also, the capacitance can be increased by configuring multiple capacitors in parallel.

Ceramic capacitors are produced for component packages by processes which include layering alternating thin conductors which form electrodes, and unfired ceramics slayers called greensheets (nominally 0.2 mm to 0.28 mm thick) which form the dielectrics. Processes such as metal mask extrusion printing, silk screen printing and tape casting are used to produce the capacitors. Typically, as illustrated in the exploded view of FIG. 1a, conductive layers 16 are formed adjacent to greensheet layers 14 and an additional greensheet 15 of the same area as greensheet 14 forms the dielectric layer between the conductive layers. Alternately, multiple capacitors may be layered within the package. The capacitors formed by these methods are thick, and the dielectric layer 15 resides on the entire surface of the greensheet layers 14.

Other processes which are directed at manufacturing multilayer capacitors include U.S. Pat. No. 3,235,939, U.S. Pat. No. 4,347,650 and U.S. Pat. No. 4,586,972 which disclose methods of making discrete capacitors which can not be integrated into a ceramic package.

A capacitor component with multiple parallel capacitors can be formed to attain increased capacitance. The capacitance of parallel capacitors adds such that the total capacitance of multiple capacitors is the sum of the capacitance of each individual capacitor. Thus, capacitors in a component can be stacked and interconnected in order to increase the total capacitance of a component. The interconnection of the capacitors is important in the resulting component. Available interconnections methods do not provide interconnection flexibility of the components. FIG. 1b is a cross-sectional view of a discrete surface mount multilayer capacitor. The ceramic greensheets 44 form dielectrics, and electrodes 40 terminate at end terminals 42. The termination is not flexible and all of the capacitors of the discrete component are connected in parallel. Patternable electrodes would allow the termination flexibility necessary for interconnecting capacitors in packages in various configurations. However the aforementioned methods do not produce patterned electrode layers.

Metal mask extrusion printing and silk screen printing can produce patterned layers of conductive or dielectric materials of thicknesses from 0.6 to 2.5 mils on greensheets. Tape casting can produce greensheets as thin as 2 to 3 mils. The tape cast layers require patterned metallization deposition and require repeated handling of the flexible greensheets which introduces distortion to the greensheets. Metallization printing also causes greensheet distortion due to the interaction of the ink solvent and the greensheet organic binder. In addition, multiple oven dryings are required causing further distortion damage to the greensheets.

One approach to the patterning problem is U.S. Pat. No. 3,235,939 which discloses capacitors made from tape casted ceramic with a metallic material applied thereon. The tape cast ceramic is thick. A hole is formed in the ceramic by drilling or punching and the capacitor is fired prior to the introduction of a central solder conductor into the hole. The result is a thick discrete capacitor component with all of the stacked multiple capacitors connected in connected in parallel. Thus, the method does not provide interconnection flexibility.

Another aspect of multiple printings of thick layers of dielectric and conductors in a patterned area is the unwanted distortion that is created on the exterior surfaces of the electronic package. An area of great thickness inside the package will create a bump or bulge on the surface due to uneven unfired densities. This can cause problems with attachment of surface mount components such as integrated circuits, resistors, pins, etc. The multiple layers deposited inside the electronic package should be as thin as possible in order to maximize the surface planarity. In addition to having very thin dielectric layers to maximize the capacitance it is imperative that the dielectric layer be pinhole free so as to prevent the metallization above and below the dielectric from shorting together.

The formation of an integrated resistor is also desirable, singularly or in combination with other resistors and capacitors. Thin resistive layers of, for example, a cermet, which is a mixture of ceramic and metal, can not be formed thinly enough by the above mentioned processes to be integrated into a package.

Bearing in mind the problems and deficiencies of the prior art, it is therefore an object of the present invention to provide a process for making integrated capacitors whereby the capacitors can be created within or on the ceramic package.

It is another object of the present invention to provide a process, for applying layers to a substrate, which has rapid drying time and which does not require oven drying.

It is another object of the present invention to provide thin pinhole free layers.

A further object of the invention is to provide a process for applying layers to a substrate minimizing distortion of the substrate.

It is yet another object of the present invention to provide thin patternable layers with interconnection flexibility.

Still other objects and advantages of the invention will in part be obvious and will in part be apparent from the specification.

SUMMARY OF THE INVENTION

The above and other objects, which will be apparent to those skilled in the art, are achieved by the present invention which in a first aspect relates to a method of making an integrated capacitor on a substrate comprising the steps of: a) applying conductive ink onto said substrate to form a first patterned thin conductive layer having a first clearance hole; b) applying dielectric ink onto said patterned thin conductive layer to form a patterned thin dielectric layer; c) applying conductive ink onto said patterned thin dielectric layer to form a second patterned thin conductive layer having a second clearance hole; d) forming a first through-hole in said substrate through said patterned thin layers, within the periphery of said first clearance hole and out of contact with the periphery of said first clearance hole; e) forming a second through-hole in said substrate and said patterned thin layers, within the periphery of said second clearance hole, and out of contact with the periphery of said second clearance hole; and f) filling said through-holes with a conductive material.

In another aspect, the present invention relates to a method of making an integrated capacitor on a substrate using a carrier and by pad printing comprising the steps of: a) pad printing a conductive ink onto said carrier to form a patterned thin conductive layer having a first clearance hole; b) pad printing a dielectric ink onto said patterned thin conductive layer to form a patterned thin dielectric layer; c) pad printing said conductive ink onto said patterned thin dielectric layer to form another patterned thin conductive layer having a second clearance hole; d) transferring said patterned thin layers from said carrier to a substrate; e) forming a first through-hole in said substrate and said patterned thin layers and within the periphery of said first clearance hole, and out of contact with the periphery of said first clearance hole; f) forming a second through-hole in said substrate and said patterned thin layers and within the periphery of said second clearance hole, and out of contact with the periphery of said second clearance hole for said integrated capacitor on said substrate; and g) filling said through-holes with a conductive material to form connectors.

In another aspect, the present invention relates to an integrated capacitor on a substrate comprising: a patterned thin conductive layer having a first clearance hole; another patterned thin conductive layer having a second clearance hole; a patterned thin dielectric layer positioned between said patterned thin conductive layers; a first through-hole in said substrate through said first clearance hole and said patterned thin layers; a second through-hole in said substrate through said second clearance hole and patterned thin layers; and a conductive material in said through-holes forming connectors for said integrated capacitor on said substrate.

In another aspect, the present invention relates to a method of forming an integrated capacitor and resistor in an electronic component substrate by pad printing comprising the steps of: a) pad printing a conductive ink onto said substrate to form a first patterned thin conductive layer having first and second clearance holes; b) pad printing a resistive ink onto said first patterned thin conductive layer to form a patterned thin resistive layer having third and fourth clearance holes; c) pad printing a conductive ink onto said patterned thin resistive layer to form a second patterned thin conductive layer having a fifth clearance hole; d) pad printing a dielectric ink onto said second patterned thin conductive layer to form a patterned thin dielectric layer; e) pad printing a conductive ink onto said patterned thin dielectric layer to form a third patterned thin conductive layer having a sixth clearance hole; f) forming a first through-hole in said substrate and said patterned thin layers and within the periphery of said first, third and fifth clearance holes, and out of contact with the periphery of said first, third and fifth clearance hole; g) forming a second through-hole in said substrate and said patterned thin layers within the periphery of said second, fourth and sixth clearance holes, and out of contact with the periphery of said second, fourth and sixth clearance hole; and h) filling said through-holes with a conductive material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1*a* is an exploded cross-sectional elevational view of the layers of a single capacitor which may be produced by the methods of metal mask extrusion printing, silk screen printing, tape casting or the like.

DESCRIPTION OF THE PREFERRED EMBODIMENT(S)

Figure 1A:
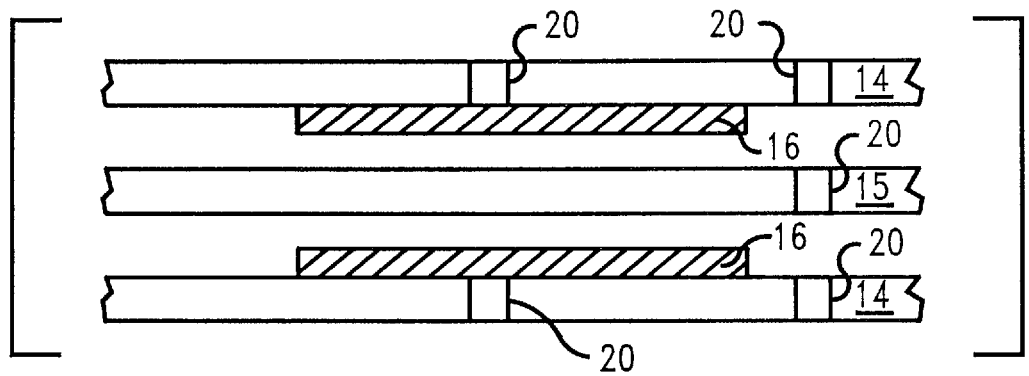
Figure 1B:
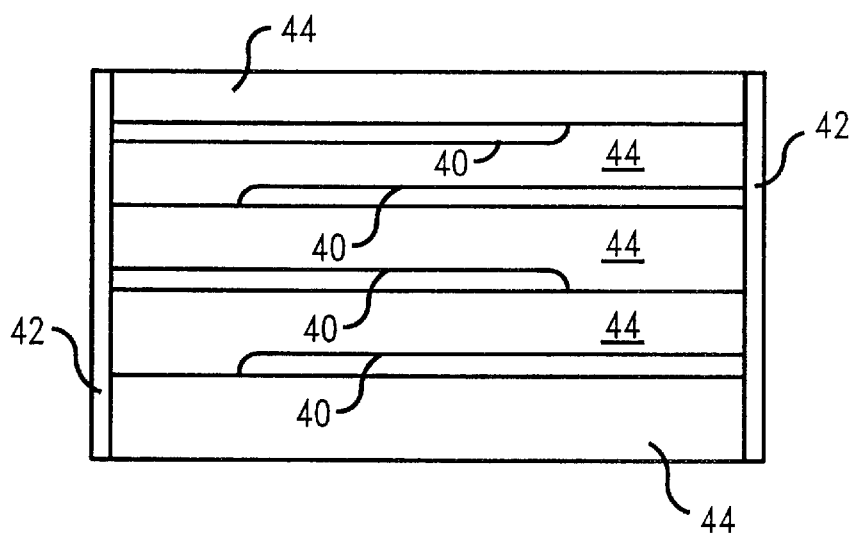
FIG. 1*b* is a cross-sectional elevational view of a discrete surface mount multilayer capacitor formed from dielectric and metal layers having end electrode terminals.

In describing the preferred embodiment of the present invention, reference will be made herein to FIGS. 1–5 of the drawings in which like numerals refer to like features of the invention. Features of the invention are not necessarily shown to scale in the drawings.

The present invention uses a pad printing device to apply multiple layers of alternating materials onto a substrate or greensheet in a desired pattern forming patterned conductive, dielectric and/or resistive thin layers. The configuration of the layers is determinative of the integrated electronic components formed by the layers. Pad printing may be performed by one skilled in the art and generally comprises the steps of flooding an etched plate with an ink stroke, clearing the plate of ink except in the etched areas, picking up the ink on the plate with a pad, typically silicone rubber, and transferring the ink from the silicone pad onto the workpiece. The pad printed layers are significantly thinner than the layers produced by methods such as silk screen printing, metal mask extrusion printing or tape casting or the like. The very thin layers (from about 5 to 30 microns) permit the components to be integrated on the substrate.

Capacitors are formed by layering a dielectric between conductive electrode layers. The area of the dielectric layer of the capacitor must be larger than the area of the electrode layers and must be pinhole free so as to prevent the electrode layers from shorting together. Resistors are formed by layering a resistive material between conductive layers to form a resistor with conductive leads. Varying combinations of resistors and capacitors connected in series or in parallel may be pad printed onto the substrate to form integrated electronic components.

Figure 2A:
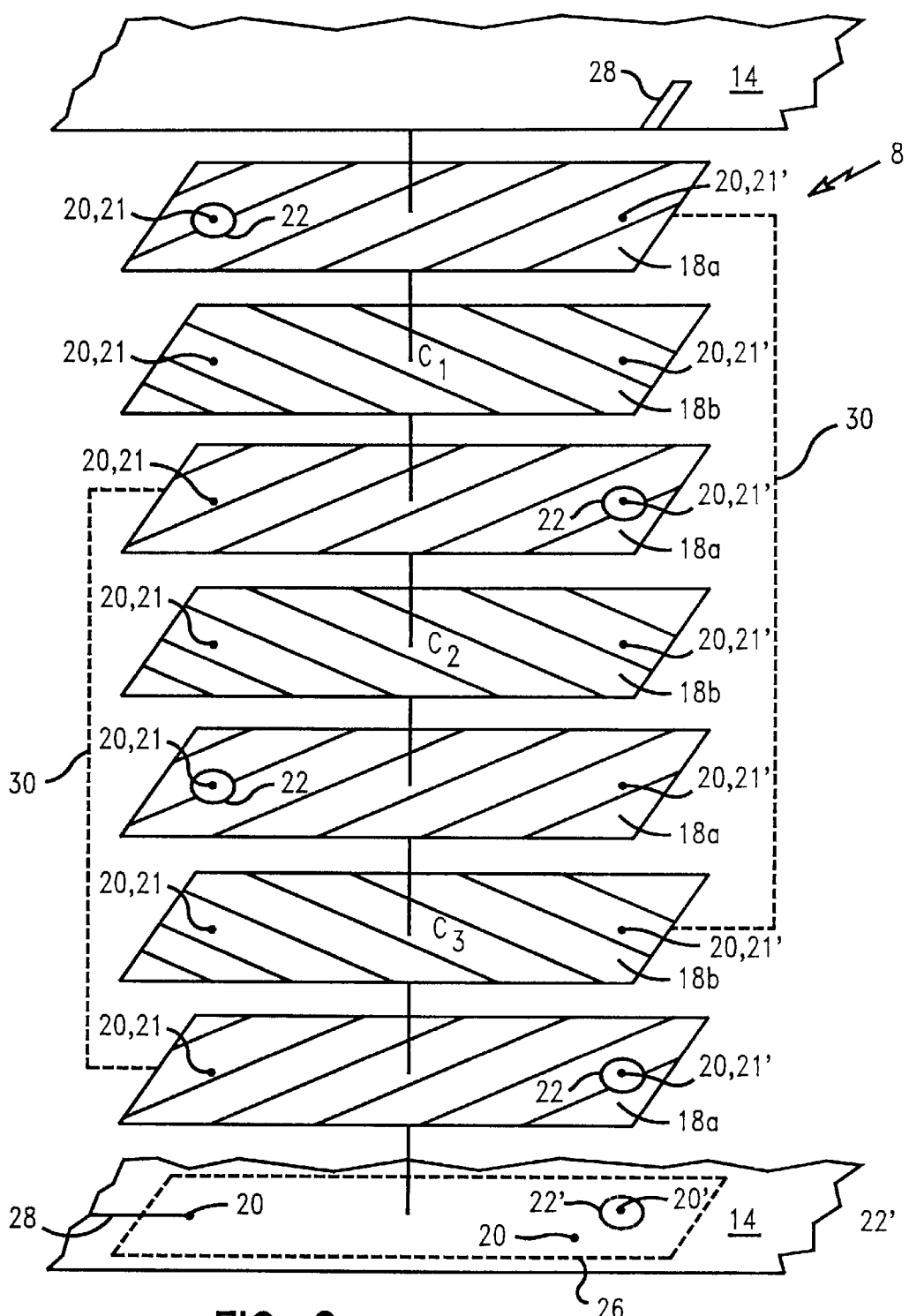
FIG. 2*a* is an exploded perspective view of the layer configuration of three parallel integrated capacitors which have been pad printed onto a greensheet, the dashed lines illustrate the electrical connection performed by the filled via and clearance hole configuration.
Figure 2B:
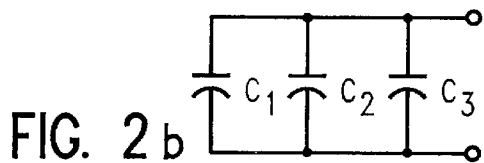
FIG. 2*b* is an electric circuit diagram of the capacitor connection of FIG. 2*a*.

An integrated electronic component 8 is illustrated in FIG. 2a where substrate, 14 is a greensheet and patterned thin layers are pad printed onto the greensheet. The greensheet is significantly larger than the patterned thin layer. Dielectric layers 18b and electrode layers 18a form the three parallel capacitors $C_1$, $C_2$, and $C_3$. The dielectric layers are larger in area than the electrode layers to prevent shorting. Clearance holes 22 in the electrode layers 18a allow pass-through via connections 20 which, after printing or lamination of the greensheets, electrically isolate the electrode layers 18a from conductive vias 20. The dashed lines 30 illustrate the electrical connection achieved between the layers after the through-holes 21, 21' are filled with a conductive material to form vias. A footprint 26, shown with dashed lines, on the lower greensheet 14 indicates the positioning of the layering on the greensheet 14. A clearance hole footprint 22' indicates the position of the clearance hole 22 of adjacent layer 18a. While the clearance holes 22 is illustrated with a circular shape, other shaped clearance holes may be formed. A via 20' is formed in the greensheet 14 and shown positioned within the clearance hole footprint 22'. FIG. 2b illustrates the electrical circuit diagram of the capacitors of FIG. 2a.

The capacitor of the present invention is made by sequentially pad printing multiple patterned thin layers onto a substrate using a pad printing device. The method of making the capacitor comprises the following steps. First, a conductive ink is pad printed onto the substrate to form a patterned thin conductive layer. A first clearance hole is included in the patterned layer. The clearance hole allows an electrical connector formed in the capacitor to pass through certain conductive layers without electrically connecting to the layer. Next, a dielectric ink is pad printed onto the patterned thin conductive layer to form a patterned thin dielectric layer and a conductive ink is pad printed onto the patterned thin dielectric layer to form another patterned thin conductive layer having a second clearance hole. Once the patterned layers with clearance holes are formed, a dielectric ink is pad printed over all the patterned layers or alternately a thin greensheet 14 may be laminated onto the layers, as shown in FIGS. 2a. Then, a first through-hole 21 is formed in the substrate through the patterned thin layers and within the periphery of said first clearance hole. Next, a second through-hole 21' is formed in said substrate and said patterned thin layers and within the periphery of said second clearance hole. The through-holes 21, 21' are filled with a conductive material to form a connector or via 20 which can make an electrical connection to desired layers. The connector does not connect the layers in which the respective through-hole was formed within the periphery of the clearance holes.

Alternately, integrated components may be made by pad printing the patterned thin layers onto a carrier (not shown) and transferring the layers to a substrate prior to forming vias and filling the vias with conductive material. The carrier may be made from a polymer, a metal, a glass foil or a glass plate which has been coated with a thin release layer. The process of making electronic components using a carrier includes the steps of depositing the dielectric, conductive or resistive layers onto a carrier in reverse order to the order desired on the substrate. The carrier is then positioned onto the substrate and the patterned layers are transferred from the carrier to the substrate by heat and pressure lamination. Alternately, an adhesive may be used to attach the patterned layers to the substrate. After the layers have been transferred to the substrate, the carrier is released from the patterned layers attached to the substrate. The choice of release layer is dependent upon the solvent in the ink being used. An example of a release layer which would not be soluble in a Butanol and Butyl Acetate mixture would be a low ethoxyl content ethylcellulose.

Connections to other components on the electronic package may be made by a filled through-hole or via or by screen printing a conductor 28 as in FIG. 2a and laminating. Screened connections can be made by extruding a molybdenum or tungsten paste through a nozzle to a metal mask which is in contact with the substrate. Via connections can be filled in by the same screening process. FIGS. 2–5 illustrate either one or two vias in the layers. Additional electrical configurations may be provided by multiple through-holes in the layers. For example, multiple capacitor and resistor values may be configured in series or parallel connections or in a combination of series and parallel connections. Also, redundant filled through-holes may be used to increases the reliability of the via to conductive layer connection.

The processes of lamination and sintering are performed after forming the layer configuration desired, forming through-holes and filling the holes to form vias. Lamination can be performed by applying heat and pressure to the substrate sufficient to form a solid package. Sintering can be performed by heating the printed substrate sufficient to form a monolithic body. The thin layers do not appreciably change the thickness or density of the greensheet 14 in the area within the footprint 26 of FIGS. 2a and 5a. Thus, after sintering, a planar surface is produced which is necessary as previously explained.

Figure 3A:
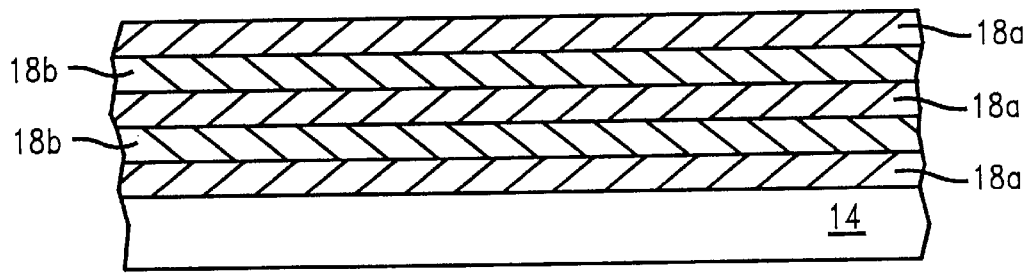
FIG. 3*a* is a cross-sectional elevational view of the thin layers for an integrated capacitor pad printed onto a greensheet.
Figure 3B:
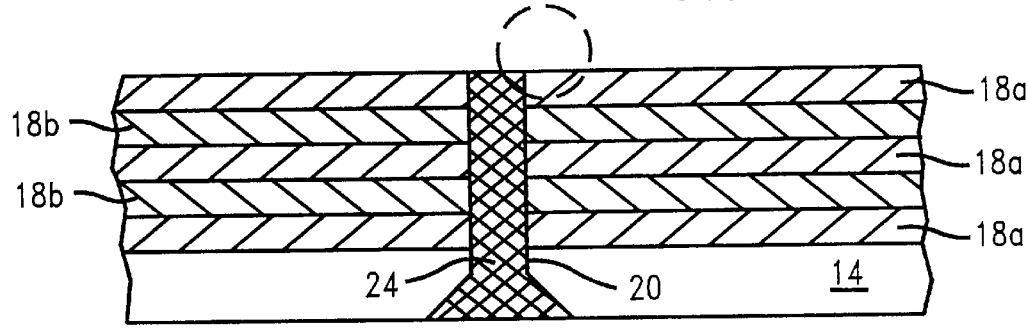
FIG. 3*b* is a cross-sectional elevational view of the thin layers of FIG. 3*a* with a via filled with conductive material, wherein in the encircled area, the conductive layer 18*a* is electrically connected to the conductive material 24.
Figure 4A:
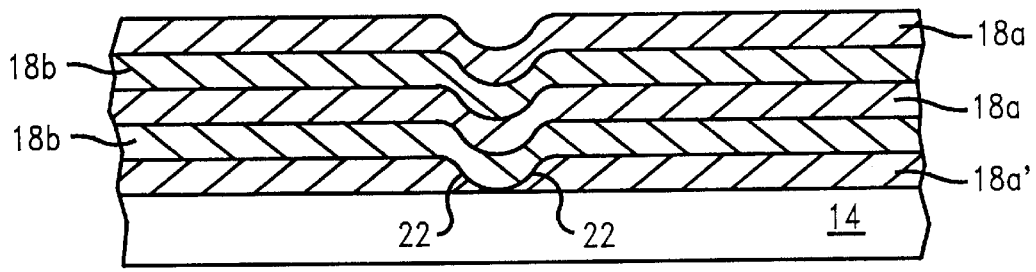
FIG. 4*a* is a cross-sectional elevational view of the thin layers for an integrated capacitor illustrating a clearance hole in layer 18*a*' adjacent to greensheet 14.
Figure 4B:
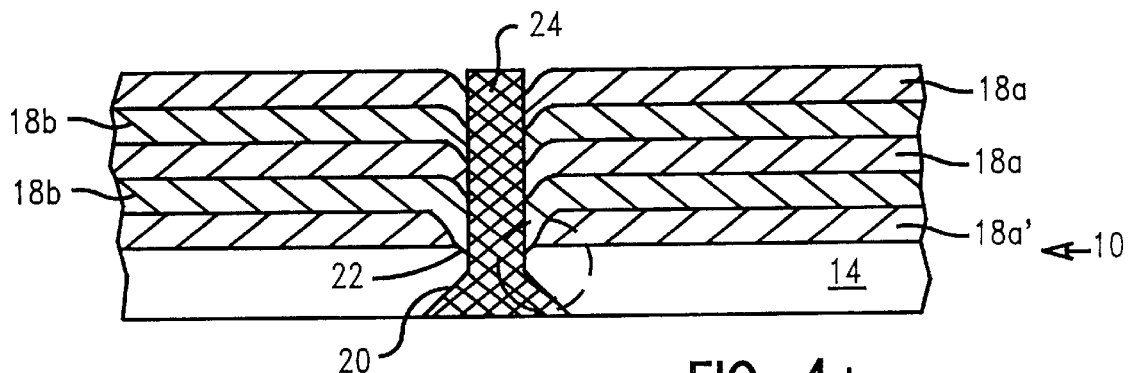
FIG. 4*b* is a cross-sectional elevational view of the thin layers of FIG. 4*a* with a via hole filled with conductive material wherein in the encircled area, the conductive layer 18*a*' is not electrically connected to conductive material 24.

FIG. 3a illustrates a cross-sectional view of the thin layers for parallel integrated capacitors. In FIG. 3b conductive material 24 is electrically connected to the conductive layers 18a. FIG. 4a illustrates thin conductive layers 18a and 18a' and dielectric layers 18b for the parallel integrated capacitors 10. Layer 18a' has a clearance hole 22 which was pattern printed with the layer 18a'. The thinness of the layers 18a, 18b and 18a' allows the adjacent layers to fill in the area of the clearance hole 22. FIG. 4b illustrates the layers of FIG. 4a, the absence of an electrical connection between layer 18a' and conductive material 24 is facilitated by clearance hole 22 in layer 18a'. The thinness of the layers allows the insulation of the conductive layer 18a' from conductive material 24 by the dielectric layer 18b which fills in the clearance hole 22 as illustrated in FIG. 4b.

The pad printer is used to apply multiple layers of alternating materials such as metal, ceramic or cermet to a greensheet. The thin layers of the materials are applied from an ink solution in a desired pattern. The inks are formulated with a solvent which provides sufficient evaporation rates suitable for rapid drying and alleviate the need for oven drying which can distort the substrate. Also, because the layers are very thin (from about 5 to 20 microns), integration of components is possible.

The conductive inks are made from an organic binder, one or more solvents and a conductive material in the form of powder or flakes. The powders or flakes may be selected from a group consisting of copper, molybdenum, silver, gold, platinum, palladium, rhodium, nickel and their alloys, oxides and mixtures thereof. Metal flakes are the preferred solids since they produce very thin conductive layers which lie flat when deposited on the surface of the substrate. The flake size is chosen in order to produce a desired fired thickness of the metallization layer.

Figures 5A, 5B:
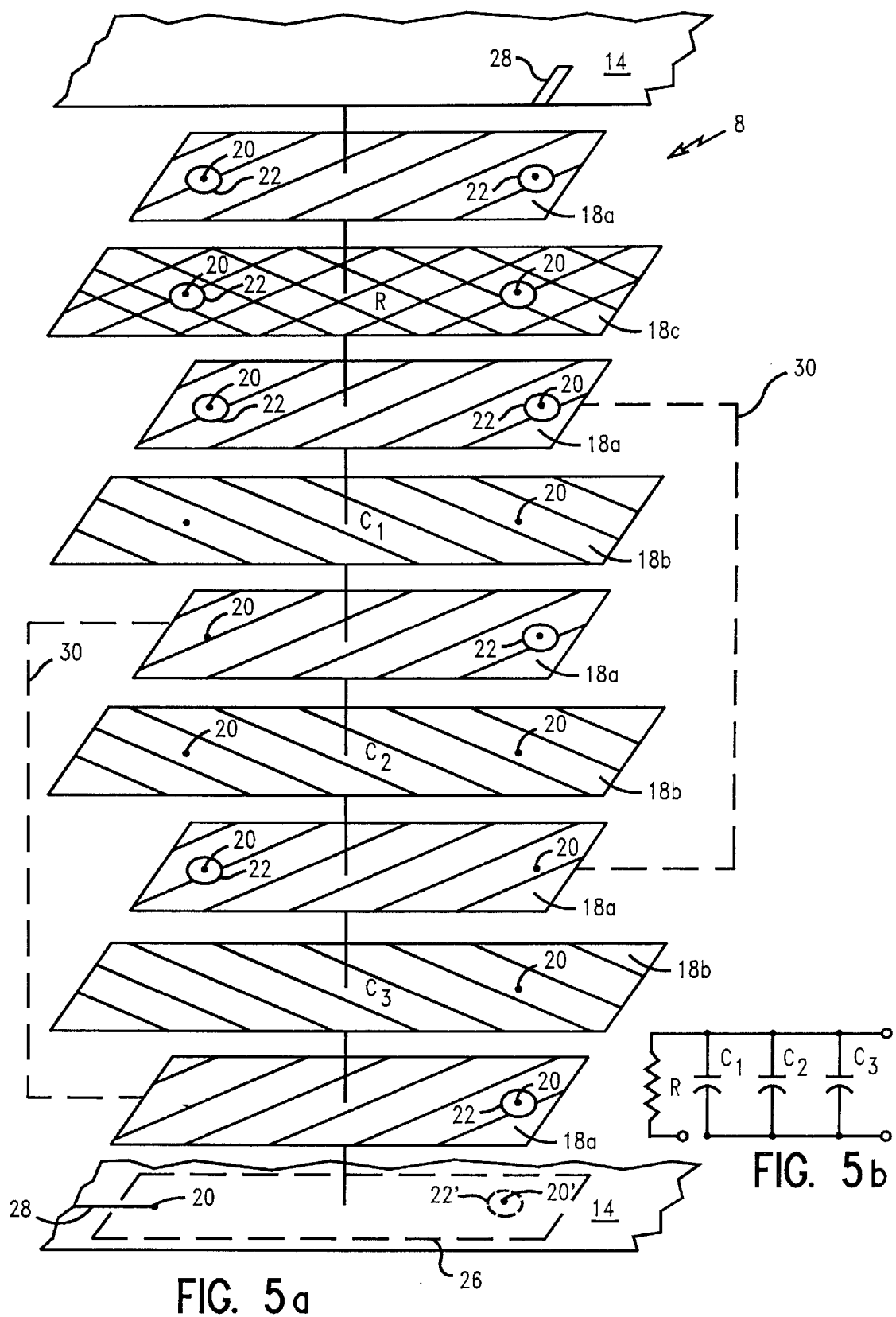
FIG. 5*a* is an exploded perspective view of the layer configuration of three parallel integrated capacitors and a resistor which have been pad printed onto a greensheet.
FIG. 5*b* is an electric circuit diagram of the capacitor and resistor connection of FIG. 5*a*.

Resistive inks may also be used to form resistors individually or in combination with capacitors in the integrated package. FIG. 5a illustrates an exploded view of an integrated package 8 which combines a resistor R and three parallel capacitors $C_1$, $C_2$, and $C_3$ the electrical connection of which is illustrated in the circuit diagram of FIG. 5b. The configuration is illustrative of the type of component which may be formed by the methods described. Alternately, other combinations of the components may be formed and interconnected on a substrate. The combinations are constrained by the physical construction of the layers and the dielectric, conductive and resistive compositions of the layers. The resistor R is formed from a resistive ink, for example, a cermet ink, and is positioned between conductive layers 18a which form leads for the resistor R. The area of the resistor R must be greater than the area of the conductive layers 18a on either side of the resistor in order to prohibit the leads from shorting together. The conductive layers or electrodes 18a on either side of the resistor 18c provide leads to the resistor 18 and have clearance holes 22 which prevent the leads 18a from shorting together when the through-holes have been filled. The dashed lines 30 of FIG. 5a connecting conductive layers 18a illustrate the electrical connection of the layers after the through-holes have been filled with conductive material to form vias. Once the patterned layers with clearance holes are formed, a dielectric ink is pad printed over all the patterned layers or alternately a thin greensheet 14 may be laminated onto the layers, as shown in FIGS. 2a. The greensheets 14 are significantly greater in area than the patterned thin layers. A footprint 26 is outlined in dashed lines on one greensheet 14 indicating the positioning of the layering on the greensheet. A clearance hole footprint 22' indicates the position of the clearance hole 22 of adjacent layer 18a. A via 20' is formed in the greensheet 14 and shown positioned within the clearance hole footprint 22'.

The inks listed in Table 1 were used to make the patterned thin layers of the invention. The compositions of the inks are given in percent by weight. Resistive inks may be formulated by combining dielectric and conductive inks. Additional inks with dielectric, conductive or resistive qualities may be employed. The preferred polyvinyl Butyral organic binder is "BUTVAR B-76" manufactured by Monsanto of St. Louis, Missouri.

TABLE 1

| COMPONENTS | DIELECTRIC INK | CONDUCTIVE INK (Mo) | CONDUCTIVE INK (Cu) |
| --- | --- | --- | --- |
| Solids | Alumina/Glass (48%) | Molybdenum Powder (54%) | Copper Powder (70%) |
| Organic Binder | Polyvinyl Butyral (4%) | Polyvinyl Butyral (3%) | Polyvinyl Butyral (2%) |
| Solvents | Butanol (29%) Butyl Acetate (19%) | Butanol (26%) Butyl Acetate (17%) | Butanol (17%) Butyl Acetate (11%) |

The very thin layers, from about 5 to 20 microns, of the present invention provide integrated electronic components within or on the ceramic package. The layers are derived from fast drying inks which do not require substantial heat for drying and therefore minimize greensheet or substrate distortion. The inks can be applied in very thin layers and are patternable. Clearance holes patterned in the inks allow the pass-through of electrical connections and interconnection flexibility. Further, the layers are pinhole free which prevents them from shorting together.

While the present invention has been particularly described, in conjunction with a specific preferred embodiment, it is evident that many alternatives, modifications and variations will be apparent to those skilled in the art in light of the foregoing description.

It is therefore contemplated that the appended claims will embrace any such alternatives, modifications and variations as falling within the true scope and spirit of the present invention.

Thus, having described the invention, what is claimed is:

1. An integrated capacitor on a substrate comprising:

a patterned thin conductive layer having a first clearance hole;

another patterned thin conductive layer having a second clearance hole;

a patterned thin dielectric layer positioned between said patterned thin conductive layers;

a first through-hole in said substrate through said first clearance hole and said patterned thin layers;

a second through-hole in said substrate through said second clearance hole and said patterned thin layers;

a conductive material filling said through-holes forming connectors for said integrated capacitor on said substrate; and, another conductive material in said substrate forming connections with the conductive filled through-holes for electrically connecting other components to said integrated capacitor, wherein said another conductive material is printed to said substrate in a shape different than the conductive filled through-holes.

2. The integrated capacitor of claim 1 wherein said another conductive material on said substrate comprises a molybdenum paste.

3. The integrated capacitor of claim 1 wherein said another conductive material on said substrate comprises a tungsten paste.

4. An integrated capacitor on a substrate comprising:

a patterned thin conductive layer having a first clearance hole;

another patterned thin conductive layer having a second clearance hole;

a patterned thin dielectric layer positioned between said patterned thin conductive layers;

a first through-hole in said substrate through said first clearance hole and said patterned thin layers;

a second through-hole in said substrate through said second clearance hole and said patterned thin layers; and, a conductive material in said through-holes forming connectors for said integrated capacitor on said substrate;

whereby a portion of said dielectric layer fills in said first and second clearance holes and facilitates the insulation of said patterned thin conductive layers from said conductive material in said first and second through-holes.

* * * * *